United States Patent [19]

Yamamoto et al.

[11] Patent Number: 5,113,151
[45] Date of Patent: May 12, 1992

[54] EQUALIZING AND AMPLIFYING CIRCUIT IN AN OPTICAL SIGNAL RECEIVING APPARATUS

[75] Inventors: Takuji Yamamoto; Hiroshi Hamanō, both of Kawasaki; Izumi Amemiya, Yokohama; Yasunari Arai, Tokyo; Takeshi Ihara, Kawasaki, all of Japan

[73] Assignee: Fujitsu Limited, Kawasaki, Japan

[21] Appl. No.: 554,375

[22] Filed: Jul. 19, 1990

[30] Foreign Application Priority Data

Jul. 21, 1989 [JP] Japan .............................. 1-189190
Aug. 10, 1989 [JP] Japan .............................. 1-207571

[51] Int. Cl.$^5$ ........................................... H03F 17/00
[52] U.S. Cl. ............................... 330/308; 250/214 A; 250/214 AG
[58] Field of Search .......... 330/59, 308; 250/214 A, 250/214 AG; 455/619

[56] References Cited

U.S. PATENT DOCUMENTS 4,870,369 9/1989 Bartenstein et al. ............. 330/308 X

FOREIGN PATENT DOCUMENTS 2720614 11/1978 Fed. Rep. of Germany ...... 330/308

Primary Examiner—James B. Mullins
Attorney, Agent, or Firm—Staas & Halsey

[57] ABSTRACT

Disclosed is an equalizing and amplifying circuit in an optical signal receiving apparatus comprising a preamplifier circuit having an input terminal connected to the output of a light receiving element. The preamplifier circuit amplifies the electrical signal from the light receiving element and outputs an amplified signal. An automatic gain control circuit is connected to the output of the preamplifier circuit. The preamplifier circuit comprises a transistor having a common-base, a current source connected to the emitter of the transistor for supplying a bias current to the transistor, and a load resistor connected to the collector of the transistor. The emitter of the transistor is connected to the input terminal, and the collector of the transistor is connected to the output terminal. A negative influence caused by mounting the circuit on a package is avoided and the circuit operates stably in a high frequency range.

11 Claims, 14 Drawing Sheets

EQUALIZING AND AMPLIFYING CIRCUIT IN AN OPTICAL SIGNAL RECEIVING APPARATUS

BACKGROUND OF THE INVENTION (1) Field of the Invention

The present invention relates to an equalizing and amplifying circuit in an optical signal receiving apparatus, and more particularly to an optical receiving apparatus suitable for circuit integration and having an ability to output a signal of constant and equalized amplitude.

In an optical communication system having a common trunk line, various services such as data communication or picture communication have been developed. Accompanied by those developments, high speed and long distance communication have been desired. An optical signal receiving apparatus in such an optical transmission system has an optoelectric converter for converting an optical signal received through a long distance transmission line into an electrical signal, and an equalizing and amplifying circuit for identifying the received signal. It is desired that the equalizing and amplifying circuit have characteristics of an extremely wide band width and low noise, because the current of the super high speed signal from a light-receiving element is very small due to the long distance transmission.

In addition, when the optical signal receiving apparatus is made as an integrated circuit (IC) and is mounted in a package, it is necessary to suppress the influence of parasitic inductances, caused by bonding wires between the IC chip and the package, on the characteristics of the circuit. Therefore, it is important to design the circuit in such a way that the circuit and the mounting should not separately be designed but should be designed as a single unit so that the mounting does not influence the characteristics of the circuit.

Further, the amplitudes of the optical signals transmitted through optical fibers to the optical signal receiving part are different depending on the transmission lines, deterioration of an optical signal transmitting part over several years, and so forth. It is desired, however, to output a signal of constant equalized amplitude regardless of whether the input signal amplitude is large or small.

In general, the prestage part of such an equalizing and amplifying circuit as mentioned above is constructed by a preamplifier and an automatic gain control circuit. The preamplifier circuit amplifies an electrical signal, obtained by converting an optical signal, to a predetermined signal level. The automatic gain control circuit compensates the signal levels output from the preamplifier circuit to output a signal of a predetermined level.

(2) Description of the Prior Art

Conventionally, as the preamplifier circuit, a transimpedance-type common-emitter amplifying circuit is used. The operation of this conventional circuit, however, is easily influenced by fluctuations in power supply voltage. Accordingly, the operation is easily influenced by inductances of bonding wires between the ground pattern on the package and the circuit, or between the power supply pattern on the package and the circuit, as later described in more detail with reference to the drawings.

Further, conventionally, to obtain a constant output amplitude of the equalized signal in response to a variation of the optical signal input amplitude, the multiplication factor of the light receiving element is controlled by the feedback from the output of the equalizing and amplifying circuit, the output gain of the circuit is controlled by means of an automatic gain control circuit (hereinafter referred to as an AGC circuit), or the output gain of the circuit is controlled by the combination of the above two methods.

With the method of controlling the multiplication factor of the light receiving element, however, there is a disadvantage in that the gain frequency characteristic for a small amplitude signal is changed depending on the multiplication factor. Therefore, the waveform of the output signal is changed depending on the amplitude of the input signal so that an equalized output having a gain constant amplitude cannot be obtained.

With the method of controlling the gain of the AGC circuit, there is a disadvantage in that the amplitude of the input signal to the AGC circuit is limited in order to linearly operate the AGC circuit so that a sufficient dynamic range cannot be obtained.

These disadvantages of the impossibility of maintaining a constant equalized output amplitude and insufficient dynamic range are caused by controlling the multiplication factor of the light receiving element or by controlling the gain of the AGC circuit. Accordingly, it has been desired to provide a preamplifier circuit the gain of which can be directly controlled.

SUMMARY OF THE INVENTION

An object of the present invention is to provide an equalizing and amplifying circuit in an optical signal receiving apparatus, wherein the circuit operates stably in a high frequency domain without being influenced by the bonding wires connected when the circuit is mounted in a package.

Another object of the present invention is to preamplifying circuit, the gain of which can be controlled.

To attain the above objects, there is provided, according to the present invention, an equalizing and amplifying circuit in an optical signal receiving apparatus comprising a preamplifier circuit and an automatic gain control circuit. The preamplifier circuit has an input terminal operatively connected to the output of a light receiving element for converting an optical signal into an electrical signal, and an output terminal. The preamplifier circuit amplifies the electrical signal to output an amplified signal to the output terminal.

The automatic gain control circuit is connected to the output of the preamplifier circuit, for amplifying the output of the preamplifier circuit to a predetermined level.

The preamplifier circuit comprises a first transistor having a common-base, an emitter, and a collector; a current source, operatively connected to the emitter of the first transistor, for supplying a bias current to the first transistor; and a load resistor, connected to the collector of the first transistor. The emitter of the first transistor is operatively connected to the input terminal, and the collector of the first transistor is connected to the output terminal.

The base of the first transistor is connected through a bias voltage source to a first power supply pad. The collector of the first transistor is connected through the load resistor to the first power supply pad. The emitter of the first transistor is connected through the current source to a second power supply pad.

The equalizing and amplifying circuit further comprises a package for mounting the equalizing and amplifying circuit, a first bonding wire connected between the first power supply pad and the package, and a second bonding pad connected between the second power supply pad and the package.

According to another aspect of the present invention, the equalizing and amplifying circuit further comprises a second transistor having an emitter commonly connected to the emitter of the first transistor and having a base connected to a control terminal. The control terminal is connected through a feedback loop to the output of the equalizing and amplifying circuit.

In the above aspect, the current source comprises a third transistor and a current limiting resistor. The third transistor has a collector connected to the emitter of the first transistor, a common-base, and an emitter connected to the input terminal. The emitter of the third transistor is connected through the current limiting resistor to the second power supply pad. The third transistor functions to lower the input impedance of the preamplifier circuit.

BRIEF DESCRIPTION OF THE DRAWINGS

The above objects and features of the present invention will be more apparent from the following description of the preferred embodiments with reference to the drawings, wherein.

DESCRIPTION OF THE PREFERRED EMBODIMENTS

Figure 1:
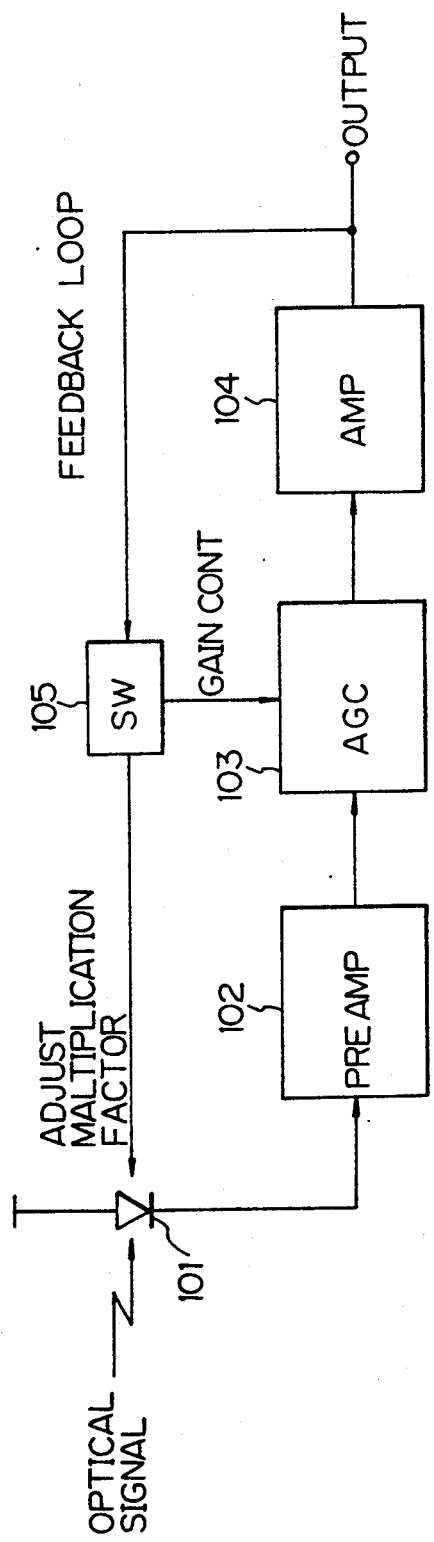
FIG. 1 is a block diagram of a conventional equalizing and amplifying circuit.

Throughout the description, the same reference numerals represent the same parts.

For better understanding of the present invention, the background and the conventional arts will first be described with reference to FIGS. 1 to 3.

FIG. 1 shows a conventional equalizing and amplifying circuit. In the figure, 101 is a light receiving element such as an avalanche photo diode (APD), 102 is a preamplifier, 103 is an automatic gain control (AGC) circuit, 104 is an amplifier circuit, and 105 is a switching circuit.

The input optical signal is converted into an electrical signal by the light receiving element 101. The electrical signal is amplified to a predetermined signal level by the preamplifier 102. The output of the preamplifier circuit 102 is input through the AGC circuit 103 into the amplifier 104 and is amplified therein. The AGC circuit compensates fluctuations of the signal levels output from the preamplifier circuit 102. The amplified signal is output from the amplifier 104.

A feedback loop is formed between the output end of the amplifier 104 and the light receiving element 101 or between the output end of the amplifier 104 and the AGC circuit 103 so that the multiplication factor of the light receiving element 101 or the gain of the AGC circuit 103 is controlled by the feedback.

By this construction, a constant amplitude of the output signal is intended to be output from the amplifier even when the intensity of the optical signal input into the light receiving element 101 is deteriorated due to distortion of an optical fiber.

Conventionally, as the preamplifier circuit, a transimpedance-type common-emitter amplifying circuit is used.

Figure 2:
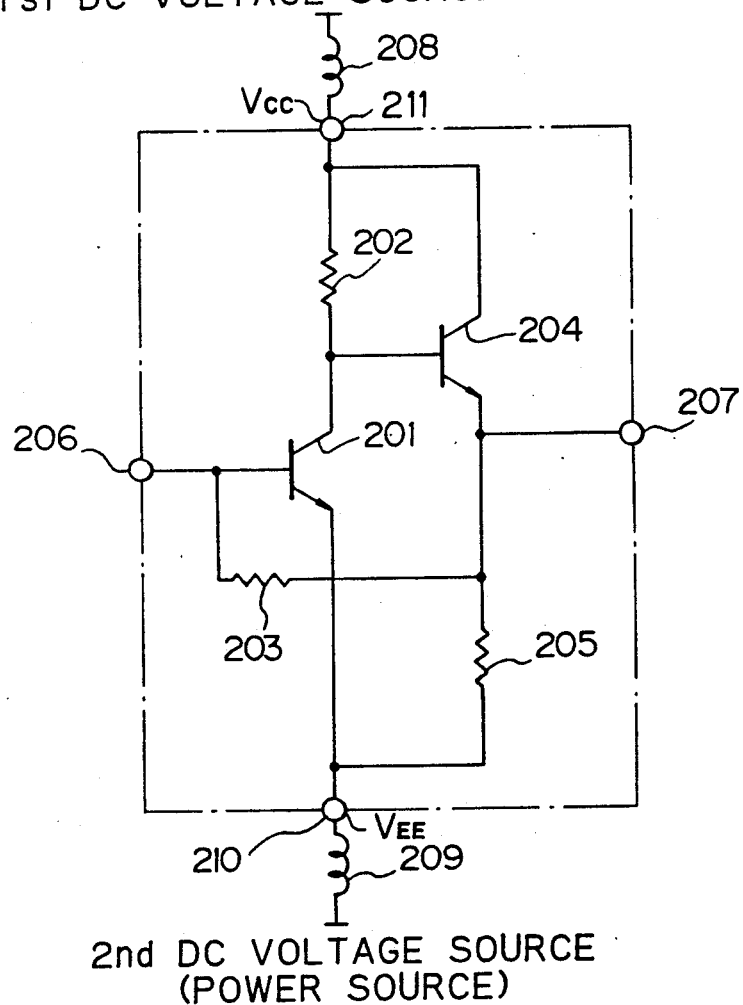
FIG. 2 is a circuit diagram of a conventional transimpedance-type common-emitter preamplifier circuit.

FIG. 2 is a circuit diagram of the conventional transimpedance-type common-emitter amplifying circuit.

In FIG. 2, the amplifying circuit includes a transistor 201 and a transistor 204. The base of the transistor 201 is connected to an input end 206. The collector of the transistor 201 is connected to the base of the transistor 204, and is connected through a load resistor 202 to a ground pad ($V_{CC}$ pad) 211. The emitter of the transistor 201 is connected to the power supply pad ($V_{EE}$ pad) 210.

The collector of the transistor 204 is connected to a ground pad 211. The emitter of the transistor 204 is connected through a feedback resistor 203 to the base of the transistor 201, through a resistor 205 to the power supply pad 210, and to an output pad 207. By this construction, the transistor 204 forms an emitter follower circuit and a negative feedback circuit including the negative feedback resistor 203. The input current signal from the light receiving element is converted by this circuit into a voltage signal and is output from the output pad 207.

The ground pad 211 and the power supply pad 210 are pads in the IC. Between the pad 211 and a first DC voltage source pattern on a package, a bonding wire 208 is connected. Also, between the pad 210 and a second DC voltage source pattern of the package, a bonding wire 209 is connected.

In the above mentioned a conventional preamplifier circuit in the equalizing and amplifying circuit, since the transimpedance-type common-emitter amplifying circuit is employed, its operation is easily influenced by fluctuations of the power supply voltage. Therefore, the circuit is easily influenced by the inductances of the bonding wires 208 and 209 especially in a high frequency range.

Figure 3:
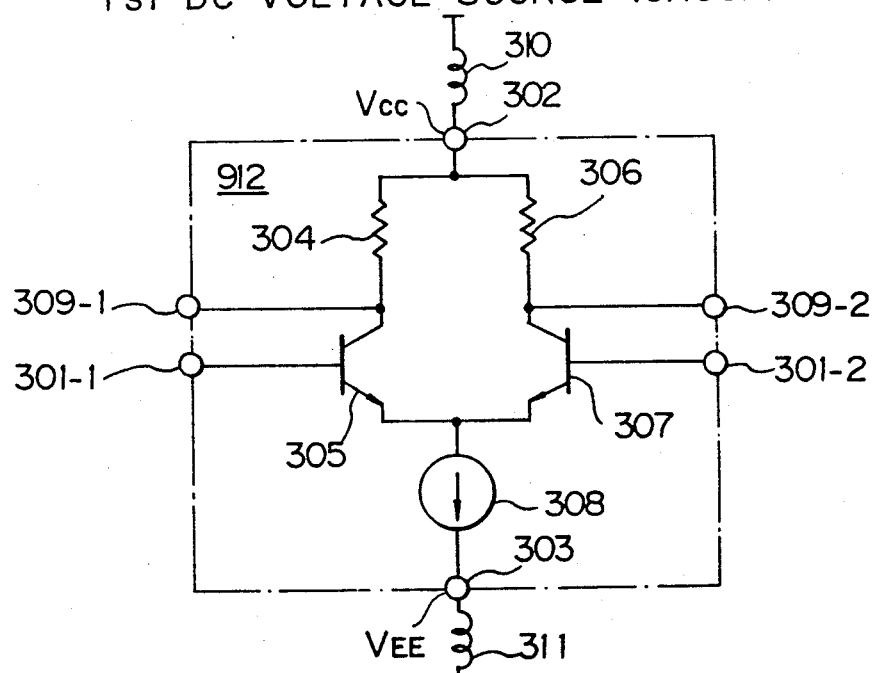
FIG. 3 is a circuit diagram of a conventional differential amplifier circuit used as an AGC circuit or a final stage amplifier circuit.

FIG. 3 is a circuit diagram of a conventional differential amplifier circuit used as the AGC circuit 103 or the amplifier circuit 104.

In the figure, the differential amplifier circuit transistor 305 is connected to an input pad 301-1, and the base of the transistor 307 is connected to another input pad 301-2. The collectors of the transistors 305 and 307 are respectively connected through load resistors 304 and 306 to a ground pad 302. The emitters of the transistors 305 and 307 are commonly connected and the commonly connected point is connected through a constant current source 308 to a power supply pad 303. The collectors of the transistors 305 and 307 are connected to output pads 309-1 and 309-2, respectively.

By this construction, a differential amplifier circuit is formed from which an output voltage signal proportional to the difference of the input voltage signals applied to the input pads 301-1 and 301-2 is obtained.

The ground pad 302 and the power supply pad 303 are pads in the IC. Between the pad 302 and the first DC voltage source pattern on a package, a bonding wire 310 is connected. Also, between the pad 303 and the second DC voltage source pattern of the package, a bonding wire 311 is connected.

The differential amplifying circuit shown in FIG. 3 is not easily influenced by fluctuations in the power supply voltage $V_{EE}$, however, it is easily influenced by the inductance of the bonding wire 310 connected between the ground pad 302 and the first DC voltage source pattern on the package.

Therefore, in the conventional circuit construction, it is necessary to stabilize the operation in both the ground side and the power supply side up to the high-frequency range.

To decrease the inductances of the bonding wires, there are some methods such as making the bonding wire as short as possible, connecting a plurality of bonding wires in parallel, or employing other mounting ideas. The lengths and the number of the bonding wires, however, are limited by the physical size of the package. Therefore, it is difficult to suppress the influences of the inductances on the characteristics by using these methods.

Further, the transimpedance-type common-emitter amplifier includes a negative feedback circuit. In the high-frequency range, however, a phase delay in the negative feedback loop is produced at a high frequency range so that a positive feedback operation is effected and peaks easily appear in the frequency characteristics.

Still further, the peaking is easily influenced by variations in parameters of a transistor in the transimpedance-type common-emitter amplifier so that it is difficult to compensate the influence caused by the variation. In addition, the characteristics of the amplifier are also changed depending on the variation of the characteristics of the transistors therein.

Referring back to FIG. 1, conventionally, to obtain a constant output amplitude of the equalized signal in response to a variation of the optical signal input amplitude, the multiplication factor of the light receiving element 101 is controlled by the feedback from the output of the equalizing and amplifying circuit, the output gain of the circuit is controlled by means of the AGC circuit 103, or the output gain of the circuit is controlled by the combination of the above two methods.

With the method of controlling the multiplication factor of the light receiving element 101, however, there is a disadvantage in that the gain-frequency characteristic for a small amplitude signal is changed depending on the multiplication factor. Therefore, the waveform of the output signal is changed depending on the amplitude of the input signal so that an equalized output having a constant amplitude cannot be obtained.

With the method of controlling the gain of the AGC circuit 103, there is a disadvantage in that the amplitude of the input signal to the AGC circuit 103 is limited in order to linearly operate the AGC circuit so that a sufficient dynamic range cannot be obtained.

These disadvantages of the impossibility of maintaining a constant equalized output amplitude and insufficient dynamic range are caused by controlling the multiplication factor of the light receiving element or by controlling the gain of the AGC. Accordingly, it has been desired to provide a preamplifier circuit having a gain which can be directly controlled.

Figure 4:
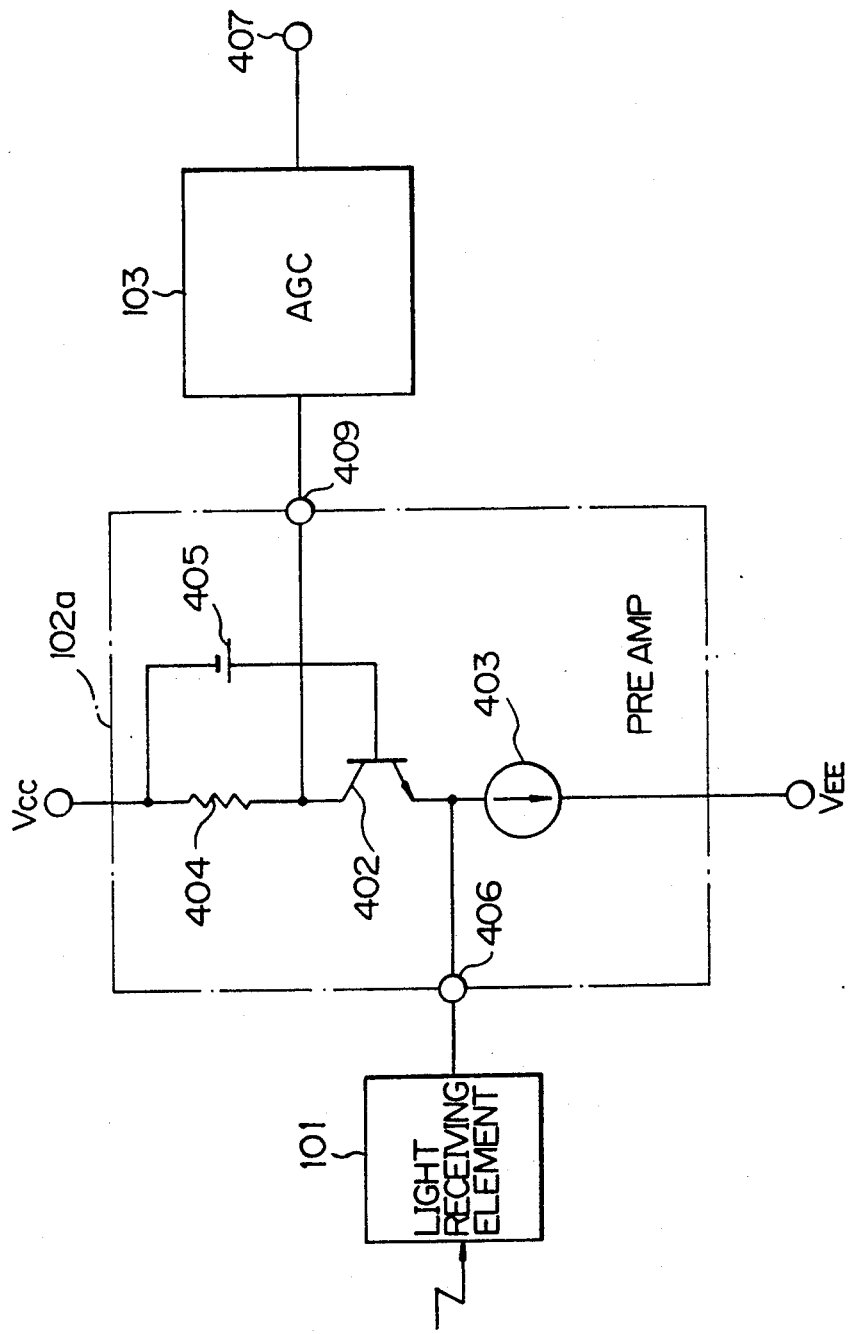
FIG. 4 is a circuit diagram showing a preamplifier circuit according to a first embodiment of the present invention.

FIG. 4 is a circuit diagram showing a preamplifier circuit according to a first embodiment of the present invention.

In FIG. 4, the equalizing and amplifying circuit of an optical signal receiving apparatus includes a light receiving element 101 such as an avalanche photodiode for converting an optical signal into an electrical signal, a preamplifier circuit 102a for amplifying the electrical signal from the light receiving element 101, and an AGC circuit 103 for amplifying the output of the preamplifier circuit 102a to a constant level.

The preamplifier circuit 102a according to the present invention includes a transistor 402 having a base connected through a bias voltage source 405 to a $V_{CC}$ pad, a current source 403 connected between the emitter of the transistor 402 and a $V_{EE}$ pad for supplying a bias current, and a load resistor 404 connected between the collector of the transistor 402 and a power supply pad $V_{CC}$. The emitter of the transistor 402 is connected to an input pad 406. The collector of the transistor 402 is connected to an output pad 409. The output signal from the light receiving element 101 is supplied through the input pad 406 to the emitter of the transistor 402. The output signal is obtained from the collector of the transistor 402. Generally, the $V_{CC}$ pad is connected through a bonding wire to the first DC voltage source (ground) pattern of the package, and the $V_{EE}$ pad is connected through another bonding wire to the second DC voltage source (power supply) pattern of the package. Alternatively, the $V_{CC}$ pad may be connected through a bonding wire to the second DC voltage source pattern of the package, and the $V_{EE}$ pad may be connected through another bonding wire to the first DC voltage source pattern of the package. In either case, the base of the transistor 402 is grounded for high frequency signals. Accordingly, the circuit shown in FIG. 4 is a common-base amplifier circuit.

In the constant current source 403, the impedance of the pad when viewed from the emitter of the transistor 402 is sufficiently high so that the operation of the preamplifier circuit is not easily influenced by the bonding wire between the pad and the package.

Further, since the circuit shown in FIG. 4 does not have a feedback circuit, peaks do not easily occur in the frequency characteristics, and the parameters of the transistor 402 do not seriously influence the characteristics of the circuit.

Figure 5:
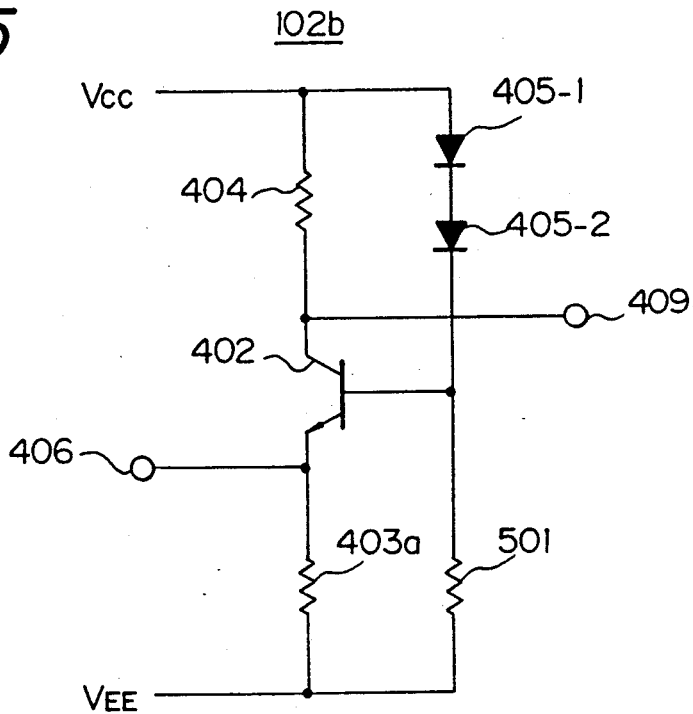
FIG. 5 is a circuit diagram of a preamplifier circuit according to a second embodiment of the present invention.

FIG. 5 is a circuit diagram of a preamplifier circuit according to a second embodiment of the present invention. In FIG 5, a resistor 403a is connected between the emitter of the transistor 402 and the $V_{EE}$ pad as a current source. Also, diodes 405-1 and 405-2 are connected between the base of the transistor 402 and the $V_{CC}$ pad as a bias to Hag source. The base is also connected through a resistor 501 to the $V_{EE}$ pad. The operating point of the transistor 402 is determined by the diodes 405-1, 405-2, and the resistor 501.

In this common-base amplifier circuit, the impedance of the resistor 403a is high for the input signal so that the signal is not influenced by the inductance of the bonding wire connected between the $V_{EE}$ pad and the power supply pattern on the package. Also, since there is no feedback circuit of the conventional transimpedance-type common-emitter amplifier circuit, peaks are rarely generated in the frequency characteristics, and the influence of the variations of the parameters of the transistors 402, namely, the parasitic capacitances between the base and the collector and between the base and the emitter, on the frequency characteristics is small.

Figure 8A:
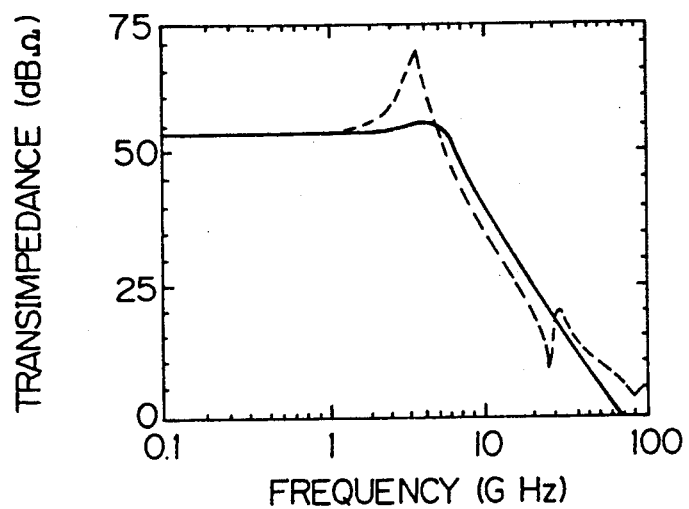
FIGS. 8A and 8B are graphs showing the influence of bonding wires on the transimpedance-frequency characteristics.
Figure 8B:
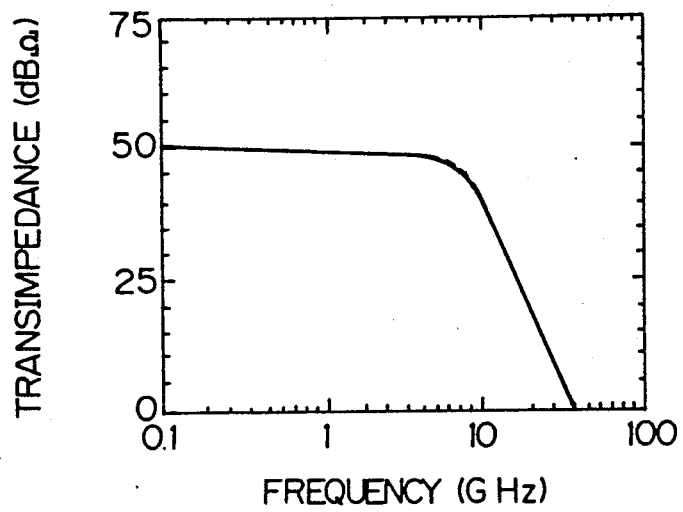

FIGS. 8A and 8B are graphs showing the influence of bonding wires on the transimpedance-frequency characteristics obtained by simulation. FIG. 8A shows the characteristics of the conventional common-emitter amplifier circuit, and FIG. 8B shows the case of the common-base amplifier circuit characteristics according to t e embodiment of the present invention shown in FIG. 5. In each of these figures, the abscissa represents the frequency of the input signal, and the ordinate represents the transimpedance corresponding to the gain of the amplifier. In FIG. 8A, the solid curve shows the frequency characteristic when the bonding wire is not connected between the $V_{EE}$ pad and the package, and the dotted curve shows the frequency characteristic when the bonding wire is connected between the $V_{EE}$ pad and the package. As is apparent from FIG. 8A, in the conventional common-emitter amplifier, peaks appear in the frequency characteristic when the bonding wire is connected. In contrast, according to the embodiment of the present invention, no peaking appears in the frequency characteristic. Accordingly, in the present invention the influence of the bonding wire on the frequency characteristic is greatly decreased so that the limitation of the mounting problems of the IC chip on the package is decreased.

Figure 9A:
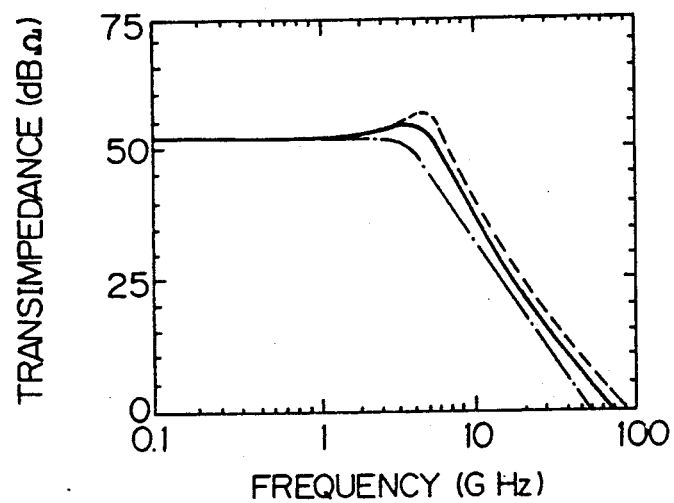
FIGS. 9A and 9B are graphs showing the influence of base-collector parasitic capacitance of a transistor on the transimpedance-frequency characteristics.
Figure 9B:
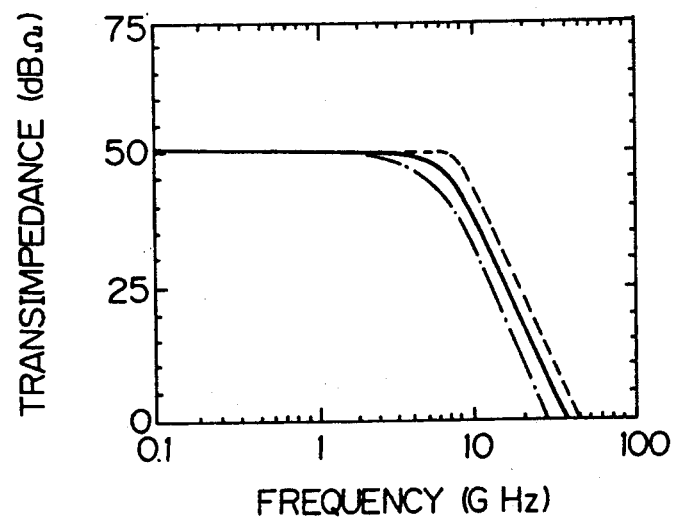

FIGS. 9A and 9B are graphs showing the influence of base-collector parasitic capacitance as a parameter of a transistor on the transimpedance-frequency characteristics obtained by simulation. FIG. 9A shows the characteristics of the conventional common-emitter amplifier circuit, and FIG. 9B shows the characteristics of the common-base amplifier circuit according to the embodiment of the present invention.

Figure 10A:
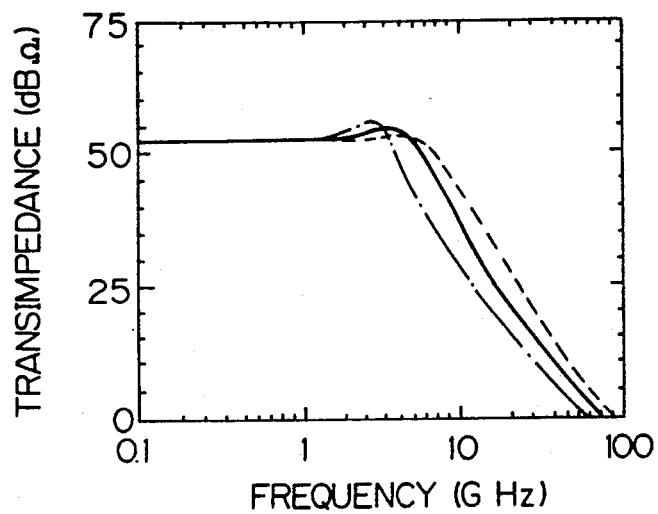
FIGS. 10A and 10B are graphs showing the influence of a base transit time of a transistor on the transimpedance-frequency characteristics.
Figure 10B:
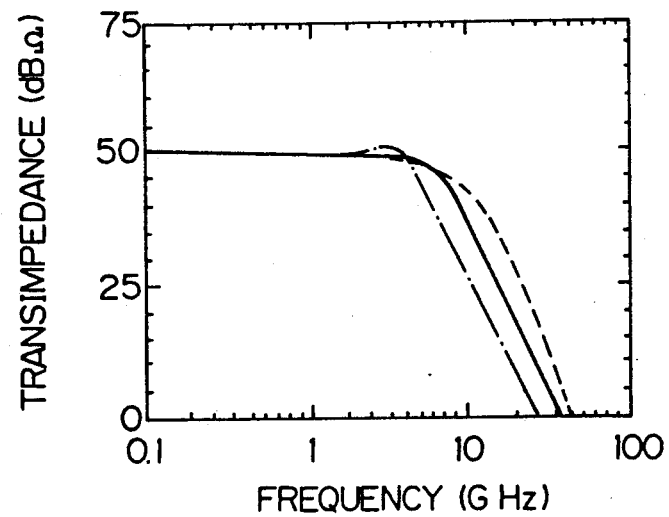

FIGS. 10A and 10B are graphs showing the influence of base-transit time $\tau_F$, as another parameter of a transistor on the trans-impedance-frequency characteristics obtained by simulation. FIG. 10A shows the characteristics of the conventional common-emitter amplifier circuit, and FIG. 10B shows the characteristics of the common-base amplifier circuit according to the embodiment of the present invention.

In FIGS. 9A, 9B, 10A, and 10B, the ordinate represents the transimpedance and the abscissa represents the frequency of the input signal. In each figure, the solid curves show the simulation result when the parameter is a standard value, the dash-dot curve shows the simulation result when the parameter is double the standard value, and the dotted curve shows the simulation result when the parameter is ½ of the standard value.

As will be apparent from FIGS. 9A and 9B, the frequency characteristic of the conventional amplifier depends largely on the base-collector parasitic capacitance and a peak appears in the curves. In the present invention the frequency characteristic does not largely depend on the parasitic capacitance and substantially no peaks appear in the curves.

As will be apparent from FIGS. 10A and 10B, the frequency characteristic of the conventional amplifier depends largely on the base transit time and peaks appear in the curves. The present invention however, does not largely depend on the base transit time and substantially no peaks appear in the curves.

Figure 6:
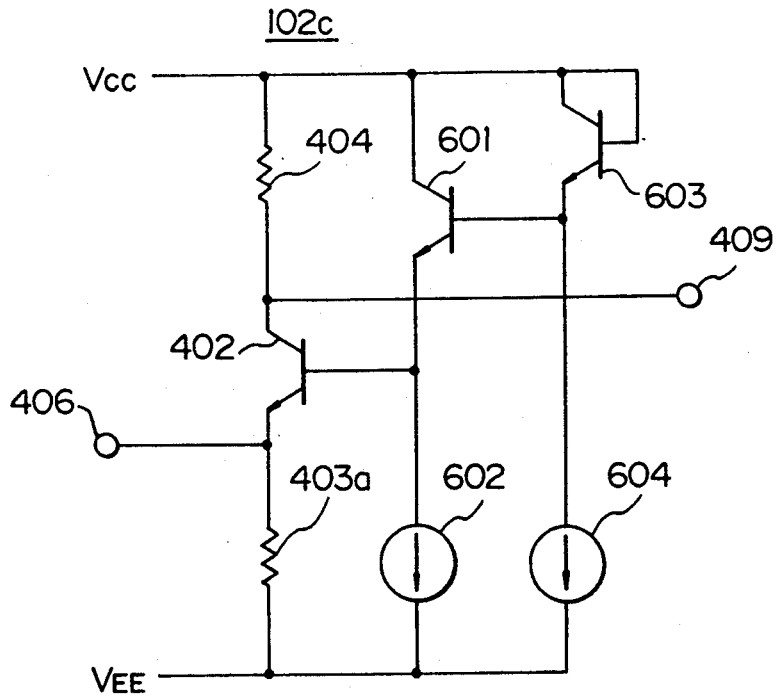
FIG. 6 is a circuit diagram of a preamplifier circuit according to a fourth embodiment of the present invention.

FIG. 6 is a circuit diagram of a preamplifier circuit according to still a third embodiment of the present invention.

In FIG. 6 a resistor 403a is connected between the emitter of the transistor 402 and the $V_{EE}$ pad as a current source. Also, transistors 601, a constant-current source 602, a transistor 603, and a constant-current source 604 are provided as a bias voltage source. The emitter of the transistor 402 is connected to the input pad 406 and through the resistor 403a to the $V_{EE}$ pad. The collector of the transistor 402 is connected to the output pad 409 and through the load resistor 404 to the $V_{CC}$ pad.

The base of the transistor 402 is connected to the bias circuit constructed by the transistors 601 and 603 and the constant-current sources 602 and 604. The bias circuit supplies a bias current to the base of the transistor 402 and determines the operating point of the amplifier circuit.

In the bias circuit, the base of the transistor 601 is connected through the transistor 603 to the $V_{CC}$ pad and through the constant-current source 604 to the $V_{EE}$ pad. By this circuit construction, the operating point of the transistor 402 is set by a low impedance circuit which is not largely influenced by the fluctuations of the power supply voltage. In addition, the transistor 601 and the constant-current source 602 form an emitter follower circuit which is a low impedance circuit and has an operating point which is not largely influenced by the fluctuations of the power supply voltage. The operating point of the transistor 402 is determined by the emitter follower circuit.

The operating point of the transistor 402 is fixed and stabilized by the bias circuit. This corresponds to the bias voltage source 405 and the constant-current source 403 in the circuit 102a shown in FIG. 4.

The operation of the circuit shown in FIG. 6 is improved over that of the circuit shown in FIG. 5 because the operating point of the transistor 402 in FIG. 6 is more stable than that in FIG. 5.

Figure 7:
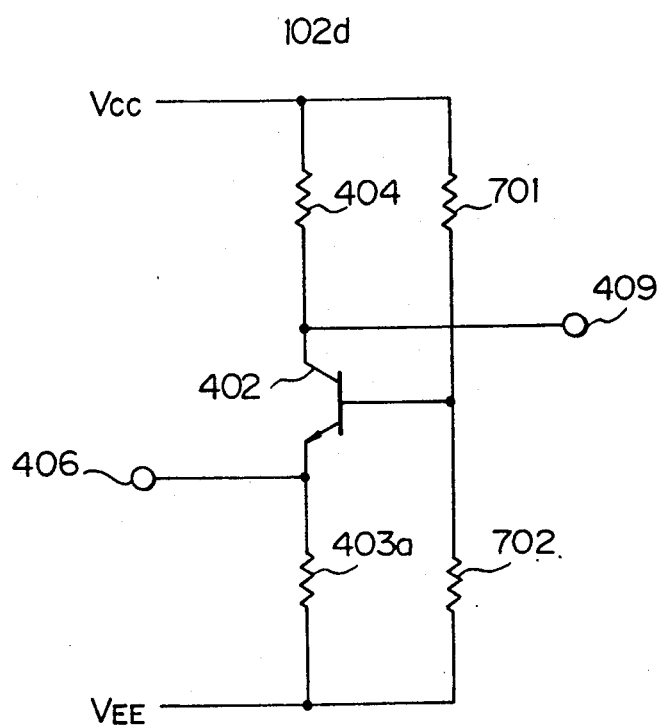
FIG. 7 is a circuit diagram of a preamplifier circuit according to a fourth embodiment of the present invention.

FIG. 7 is a circuit diagram of a preamplifier circuit according to a fourth embodiment of the present invention.

In FIG. 7, the emitter of the transistor 402 is connected to the input pad 406 and through the resistor 403a to the $V_{EE}$ pad. The collector of the transistor 402 is connected to the output pad 409 and through the load resistor 404 to the $V_{CC}$ pad. The base of the transistor 402 is connected through a resistor 701 to the $V_{CC}$ pad for receiving a bias current, and is connected through a resistor 702 to the $V_{EE}$ pad for determining the operating point.

The operating point of the transistor 402 is fixed by the resistors 701 and 702. This corresponds to the bias voltage source 405 and the constant-current source 403 in the circuit 102a shown in FIG. 4.

The circuit shown in FIG. 7 is characterized by a simple circuit construction including the resistors 701 and 702 for determining the operating point.

Referring back to FIG. 1, conventionally, a feedback loop is formed between the output end of the amplifier 104 and the light receiving element 101 or between the output end of the amplifier 104 and the AGC circuit 103 so that the multiplication factor of the light receiving element 101 or the gain of the AGC circuit 103 is controlled by the feedback.

By this construction, a constant amplitude of the output signal is intended to be output from the amplifier even when the intensity of the optical signal input into the light receiving element 101 is deteriorated due to distortion of an optical fiber or a long distance transmission.

This conventional control by the combination of the two methods, i.e., the control of the gain of the AGC circuit 103 and the control of the multiplication factor of the light receiving element 101, is explained with reference to FIG. 11.

Figure 11:
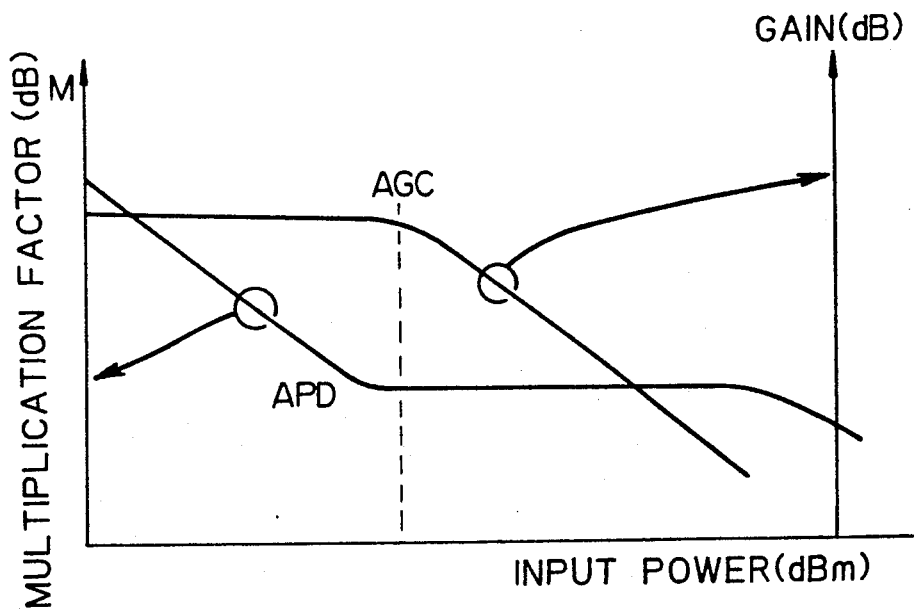
FIG. 11 is a graph of a conventional control of the light receiving element and of the AGC circuit.

FIG. 11 is a graph for explaining a conventional control of the light receiving element and of the AGC circuit.

In FIG. 11, when the input power is below a point A, the multiplication factor of the avalanche photo diode (APD) changes linearly in accordance with the input power so that the output of the equalizing and amplifying circuit shown in FIG. 1 is connected to control the APD 101 by changing the switch 105 in response to the power from the output. When the input power exceeds the point A, the gain of the AGC circuit 103 changes linearly in accordance with the input power so that the output of the circuit is connected to control the AGC circuit 103 by changing the switch in response to the power from the output.

With the method of controlling the multiplication factor of the light receiving element (photo diode), however, there is a disadvantage in that the gain-frequency characteristic for a small amplitude signal is changed depending on the multiplication factor. Therefore, the waveform of the output signal is changed depending on the amplitude of the input signal so that the equalized output of the constant amplitude cannot be obtained.

With the method of controlling the gain of the AGC of the signal input to the AGC circuit is limited in order to linearly operate the AGC circuit so that a sufficient dynamic range cannot be obtained.

These disadvantages of the impossibility of maintaining constant equalized output amplitude and insufficient dynamic range are caused by controlling the multiplication factor of the light receiving element or by controlling the gain of the AGC circuit. Accordingly, it has been desired to provide a preamplifier circuit the gain of which can be directly controlled.

Figure 12:
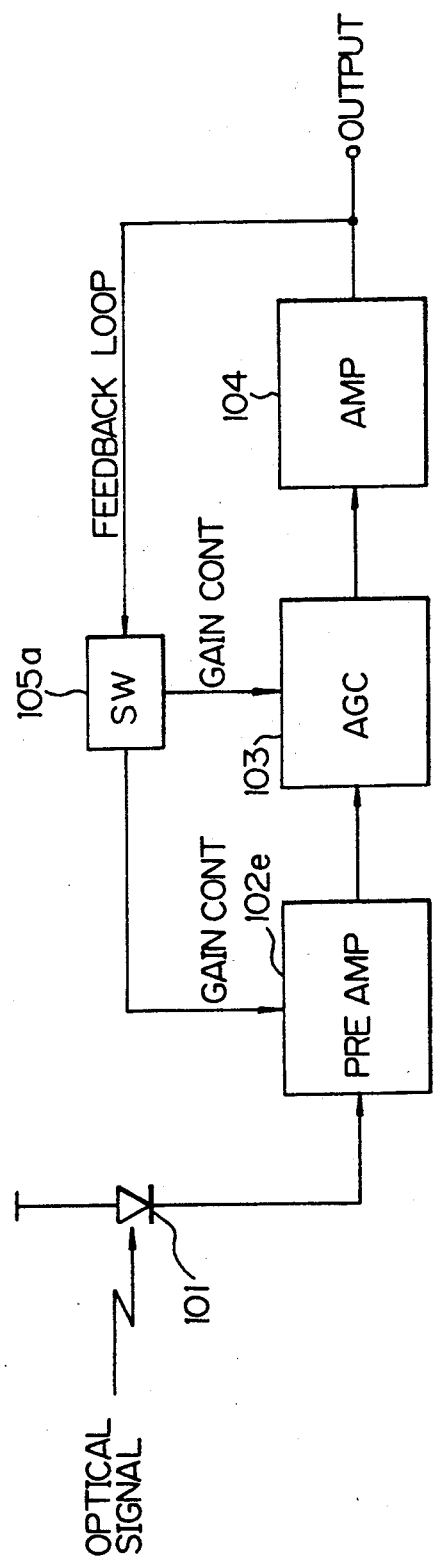
FIG. 12 is a block diagram of an equalizing and amplifying circuit according to a fifth embodiment of the present invention.

FIG. 12 is a block diagram of an equalizing and amplifying circuit according to a fifth embodiment of the present invention.

The difference between the circuit shown in FIG. 1 and the circuit shown in FIG. 12 is that, in FIG. 12, the feedback loop is not connected to the light receiving element 101 but is connected to a preamplifier circuit 102e. Namely, the preamplifier circuit 102e is directly controlled by the output of the equalizing and amplifying circuit through the feedback loop.

Figure 13:
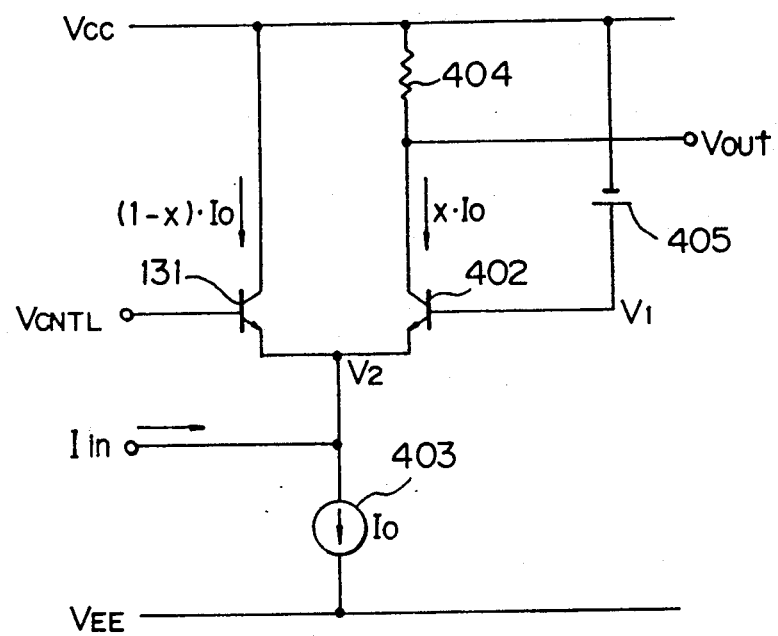
FIG. 13 is a circuit diagram of a first example of a preamplifier circuit in the circuit shown in FIG. 12.

FIG. 13 is a circuit diagram of a first example of the preamplifier circuit 102e in the circuit shown in FIG. 12.

In FIG. 13, the preamplifier circuit 102e includes a first transistor 402 having a base connected to ground through a bias voltage source 405. For a high frequency signal, the base is considered to be grounded. The circuit 102e further includes a second transistor 131 having an emitter connected to the emitter of the first transistor 402, a load resistor 404 connected to the collector of the first transistor 402, and a constant-current source 403 commonly connected to the emitters of the transistors 402 and 131. The commonly connected emitters of the transistors 402 and 131 are connected to an input terminal $I_{in}$, and the collector of the first transistor 402 is connected to an output terminal $V_{out}$. The base of the second transistor 131 is connected to a control terminal $V_{CNTL}$.

In operation, the sum of the emitter currents of the two transistors 402 and 131 and the current of an input signal supplied to the input terminal is conducted through the current source 403. Also, the emitter currents of the two transistors 402 and 131 are relatively determined by their respective base voltages.

Accordingly, when the base voltage of the second transistor 131 is a predetermined level, the emitter current of the first transistor 402 varies depending on the change of the current of the input signal. A voltage change in response to the change of the emitter current of the first transistor is output at the output terminal $V_{out}$.

By changing the base voltage of the second transistor 131, the ratio of the emitter current of the first transistor 402 to the total emitter currents of the two transistors 402 and 131 is changed.

According to this embodiment of the present invention, by changing the base voltage of the second transistor 131 having a common emitter with the base-grounded transistor 402, the emitter current flowing through the first transistor 402 is controlled. Therefore the current flowing through the load resistor 404 is controlled, and gain control is effected.

For example, assuming that the output voltage at the output terminal of the preamplifier 102e shown in FIG. 13 is $V_{out}$ and that the input current is $I_{in}$, then the transimpedance $Z_T$ is expressed as:

$$Z_T = \frac{V_{out}}{V_{in}} = \frac{xI_{in}R_L}{I_{in}} = xR_L \quad (1)$$

where $R_L$ is the resistance of the resistor 404, and x is the ratio of the emitter current of the transistor 402 to the total emitter currents I . Also, assuming that the current flowing through the current source 403 is $I_0$, then the following expressions are established with respect to the first transistor 402 and the second transistor 131:

$$(1 - x)I_0 = I_s \exp\left(\frac{V_{CNTL} - V_2}{V_T}\right) \quad (2)$$

-continued $$J_0 = I_s \exp\left(\frac{V_1 - V_2}{V_T}\right) \quad (3)$$

where $I_s$ is a reverse saturation current of the transistor, $V_T$ is a thermal voltage ($=kT/q$), $V_1$ is the base potential of the first transistor 402, and $V_2$ is the emitter potential of the two transistors 402 and 131.

From the expressions (2) and (3), x is determined as:

$$x = \frac{1}{1 + \exp\left(\frac{V_{CNTL} - V_1}{V_T}\right)} \quad (4)$$

Therefore, by substituting the expression (4) into the expression (1), the transimpedance $Z_T$ is expressed as:

$$Z_T = \frac{R_L}{1 + \exp\left(\frac{V_{CNTL} - V_1}{V_T}\right)} \quad (5)$$

Accordingly, by controlling the base voltage $V_{CNTL}$ of the transistor 131, the gain of the preamplifier circuit 102e can be controlled.

Figure 14:
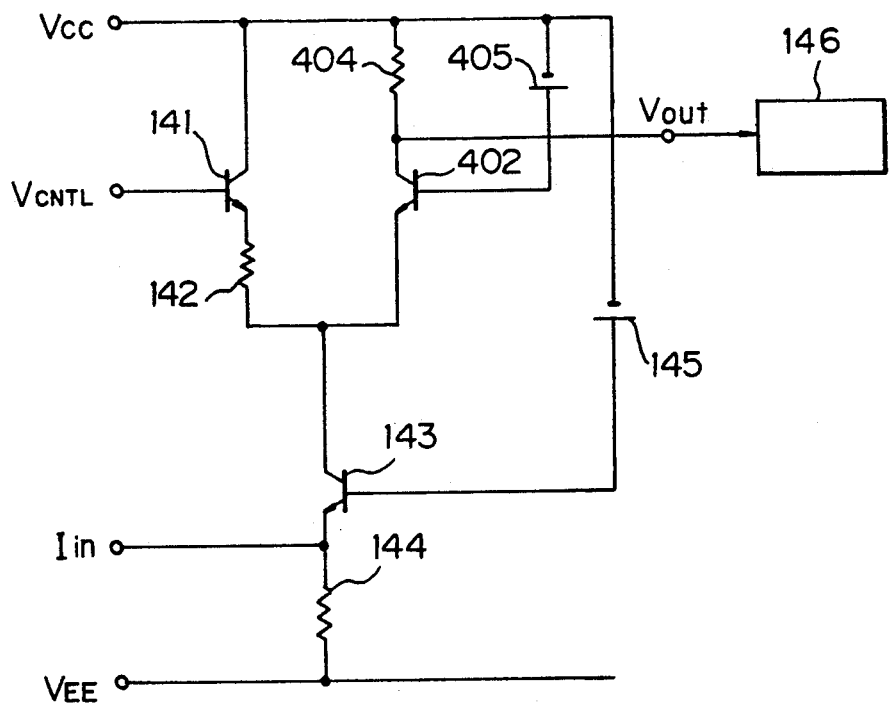
FIG. 14 is a circuit diagram of a second example of a preamplifier circuit in the circuit shown in FIG. 12.

FIG. 14 is a circuit diagram of a second example of a preamplifier circuit in the circuit shown in FIG. 12.

In FIG. 14, the preamplifier circuit 102f includes three NPN transistors 402, 141 and 143, three resistors 142, 404, and 144, and two voltage sources 405 and 145.

The transistor 143 has a base connected through the voltage source 145 to the $V_{CC}$ pad. The base of the transistor 143 is connected to the positive electrode of the voltage source 145. The emitter of the transistor 143 is connected to the input terminal $I_{in}$ and through the resistor 144 to the $V_{EE}$ pad.

The transistor 402 has a base connected through the voltage source 405 to the $V_{CC}$ pad. The base of the transistor 402 is connected to the positive electrode of the voltage source 405. The emitter of the transistor 402 is connected to the collector of the transistor 143. The collector of the transistor 402 is connected through the resistor 404 to the $V_{CC}$ pad and is also connected to the output terminal $V_{out}$ of the preamplifier circuit 102f.

The transistor 141 has a base connected to a control terminal $V_{CNTL}$, an emitter connected through the resistor 142 to the collector of the transistor 143, and a collector connected to the $V_{CC}$ pad.

In this circuit construction, the resistor 144 acts as a current source. The common-base transistor 143 functions to lower the input impedance of the preamplifier circuit 102f. The resistor 404 functions as a load resistor, and the resistor 142 provides an emitter resistance for suppressing an increase in noise when the gain is lowered.

The output terminal $V_{out}$ is connected to an emitter follower circuit 146 which converts the level of the output voltage from the output terminal $V_{out}$ and supplies the converted voltage to the next stage circuit such as an AGC circuit.

In the preamplifier circuit shown in FIG. 14, by controlling the control voltage applied to the base of the transistor 141, the ratio of the emitter currents flowing through the transistors 141 and 402 is controlled. That is the emitter current of the transistor 402 is controlled. Therefore, the collector current of the transistor 402 and thus the output voltage is controlled by the control voltage applied to the base of the transistor 141. Thus, the gain of the preamplifier circuit 102f can be controlled by the $V_{CNTL}$.

When the control terminal $V_{CNTL}$ in the circuit shown in FIG. 14 or the control terminal $V_{CNTL}$ in the circuit shown in FIG. 13 is directly connected through the feedback loop to the output terminal OUT of the equalizing and amplifying circuit shown in FIG. 12, the gain of the preamplifier circuit in FIG. 13 or 14 can be controlled. As a result, the multiplication factor of the light receiving element 101 is fixed so that the frequency characteristics for a small input signal power can be stabilized. Further, since the input of the AGC circuit 103 can be controlled by controlling the output voltage of the preamplifier circuit 102e or 102f, the nonlinear operation of the AGC circuit 103 can be avoided so that a wide dynamic range can be obtained.

Figure 15A:
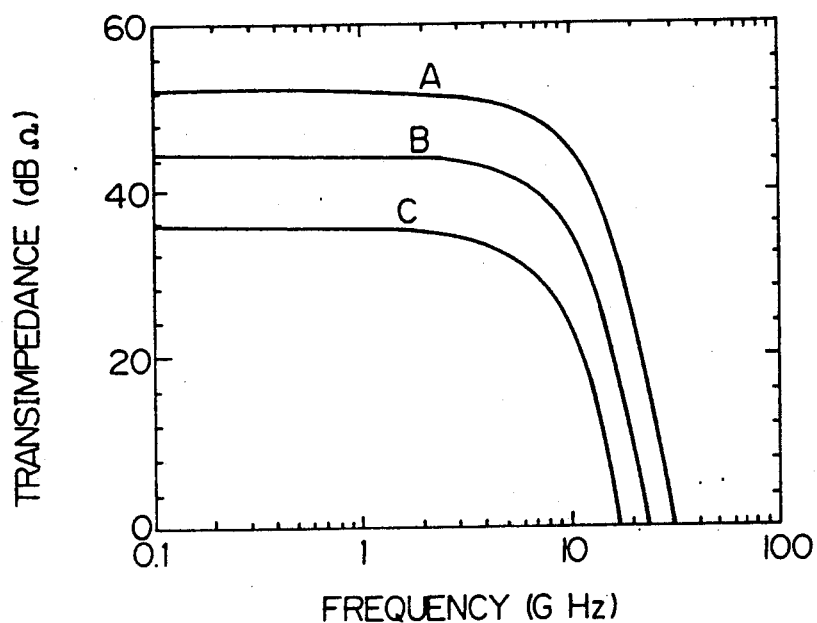
FIGS. 15A to 15C are graphs showing the frequency characteristics of the circuit shown in FIG. 14.
Figure 15B:
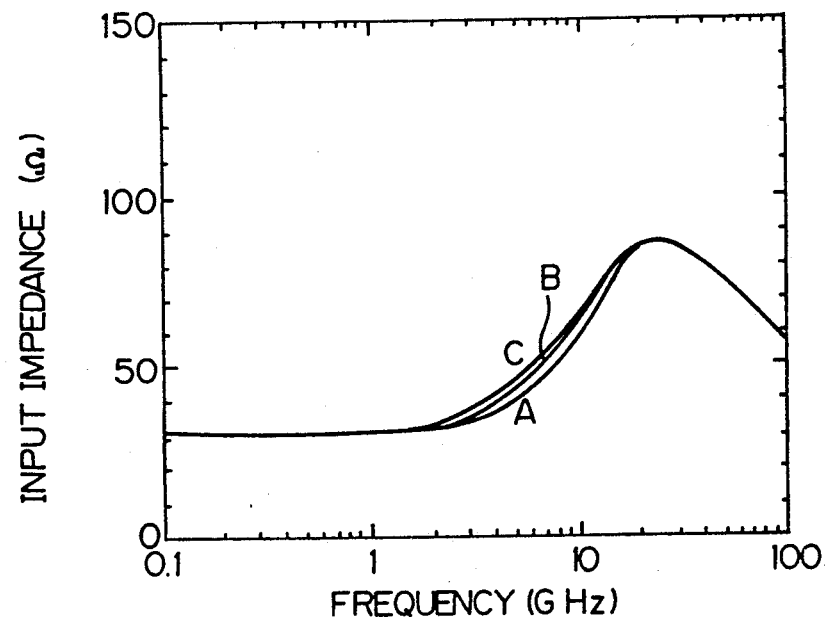
Figure 15C:
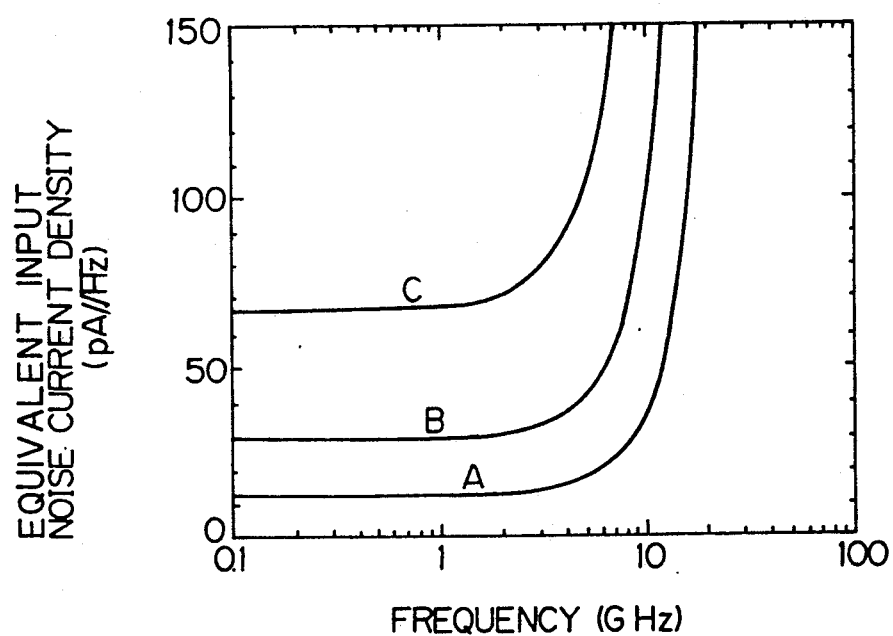

FIGS. 15A to 15C are simulation graphs showing the frequency characteristics of the circuit shown in FIG. 14.

FIG. 15A shows the relation between the transimpedance, which corresponds to the gain of the circuit in FIG. 14, and the frequency. FIG. 15B shows the relation between the input impedance and the frequency; FIG. 15C shows the relation between equivalent input noise current density and the frequency. Three curves A, B, and C in each of these figures represent the change of the characteristics depending on the change of the control voltage applied to the control terminal.

As is apparent from the figures, by changing the voltage applied to the control terminal, the transimpedance can be controlled, and the frequency characteristics of the transimpedance are almost the same. The input impedance is stable regardless of the transimpedances. The equivalent input noise current density changes depending on the change of the transimpedance, however, the degree of the change is almost the same as the change of the transimpedance.

Figure 16:
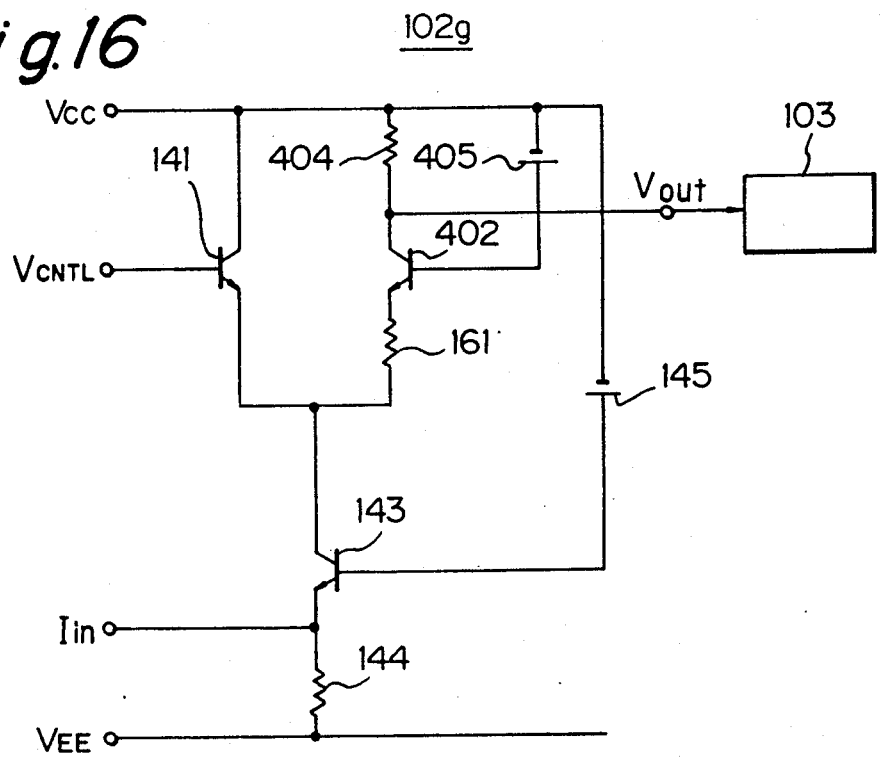
FIG. 16 is a circuit diagram of a third example of a preamplifier circuit in the circuit shown in FIG. 12.

FIG. 16 is a circuit diagram of a third example of a preamplifier circuit in the circuit shown in FIG. 12.

In the preamplifier circuit shown in FIG. 16, a resistor 161 is connected between the emitter of the transistor 402 and the collector of the transistor 143 in place of the resistor 142 in the circuit shown in FIG. 14. The resistor 161 also functions to suppress noise when the gain is lowered in the same way as the resistor 142.

Figure 17:
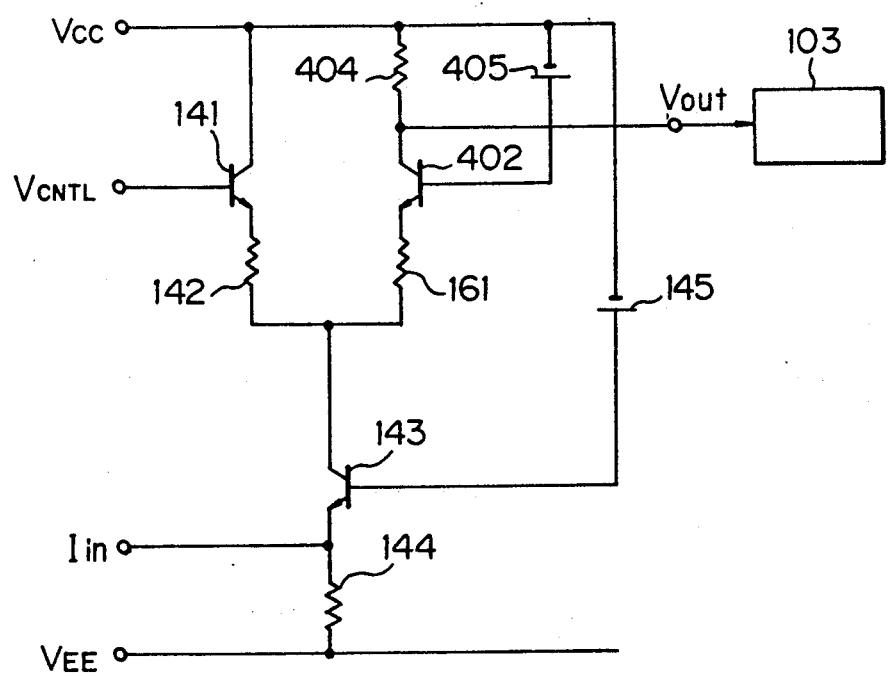
FIG. 17 is a circuit diagram of a fourth FIG. 12.

FIG. 17 is a circuit diagram of a fourth example of a preamplifier circuit in the circuit shown in FIG. 12.

In FIG. 17, both of the resistors 142 and 161 are connected between the emitter of the transistor 141 and the collector of the transistor 143 and between the emitter of the transistor 402 and the collector of the transistor 143. This allows noise to be suppressed when the gain of the circuit is lowered.

In the above described embodiments, the base of the transistor 402 is grounded through the voltage source 405 for a high frequency signal, since the preamplifier circuit in these embodiments receives an electrical signal which is obtained by converting an optical signal. The present invention, however, is not restricted by this base grounding method. When the input signal is not a high frequency, other base grounding methods may also be employed in the present invention.

Further, the above-described embodiments of the preamplifier circuits can be used not only for the optical signal receiving part but may be used in other preamplifier circuits.

From the foregoing description, it will be apparent that, according to the present invention, when an IC chip of an equalizing and amplifying circuit is mounted on a package, a negative influence of bonding wires Also, the stability of the power supply circuit for the equalizing and amplifying circuit can be improved Still further, the stability of the operation of the equalizing and amplifying circuit against the fluctuation of the power supply voltage can be improved. Still further, peaks are rarely produced in the frequency characteristics of the equalizing and amplifying circuit. Still further, the variation of the characteristics due to the variation of the parameters of the transistors is small in the equalizing and amplifying circuit according to the present invention. Accordingly, an equalizing and amplifying circuit in an optical signal receiving apparatus which is stable in operation for a high frequency and small power signal can be provided.

Still further, by forming the preamplifier circuit to have a first transistor with a common-base and a second transistor having a common emitter with the first transistor, and by controlling the base voltage of the second transistor, the emitter current of the first transistor is controlled so as to control the current flowing through a load resistor. Thus gain of the preamplifier circuit can be directly controlled.

As a result, the multiplication factor of the photo diode can be fixed so that the frequency characteristics for a small input signal power can be stabilized. Further, since the input of the AGC circuit can be controlled by controlling the output voltage of the preamplifier circuit, nonlinear operation of the AGC circuit can be avoided so that a wide dynamic range can be obtained.

We claim:

1. An equalizing and amplifying circuit in an optical signal receiving apparatus including a first power supply pad and a second power supply pad, comprising:
    a preamplifier circuit having an input terminal operatively connected to the output of a light receiving element, for converting an optical signal into an electrical signal, and having an output terminal, said preamplifier circuit amplifying said electrical signal to output an amplified signal to said output terminal;
    an automatic gain control circuit, operatively connected to said output terminal of said preamplifier circuit, for amplifying the output amplified signal from said preamplified circuit to a predetermined level;
    said preamplifier circuit comprising:
        a first transistor having a common-base, having an emitter operatively connected to said input terminal, and having a collector operatively connected to said output terminal;
        a first current source, operatively connected to the emitter of said first transistor, for supplying a bias current to said first transistor; and
        a load resistor, connected to the collector of said first transistor; and
    a bias voltage source, the base of said first transistor being connected through said bias voltage source to the first power supply pad, the collector of said first transistor being connected through said load resistor to the first power supply pad, and the emitter of said first transistor being connected through said first current source to the second power supply pad, said bias voltage source comprising:
        a second transistor having a base, an emitter and a collector;
        a third transistor having a base, an emitter and a collector;
        a second current source; and
        a third current source, the collector of said second transistor being connected to the first power supply pad, the base of said second transistor being connected to the emitter of said third transistor, the emitter of said second transistor being connected through said second current source to the second power supply pad, the base and collector of said third transistor being connected to the first power supply pad, and the emitter of said third transistor being connected through said third current source to the second power supply pad.

2. An equalizing and amplifying circuit as claimed in claim 1, wherein said first current source is a constant-current conducting resistor.

3. An equalizing and amplifying circuit in an optical signal receiving apparatus including a first power supply pad and a second power supply pad, comprising:
    a preamplifier circuit having an input terminal, operatively connected to the output of a light receiving element, for converting an optical signal into an electrical signal, and having an output terminal, said preamplifier circuit amplifying said electrical signal to output an amplified signal to said output terminal;
    an automatic gain control circuit, operatively connected to said output terminal of said preamplifier circuit, for amplifying the output amplified signal of said preamplifier circuit to a predetermined level;
    said preamplifier circuit comprising:
        a first transistor having a common-base, having an emitter operatively connected to said input terminal, and having a collector operatively connected to said output terminal;
        a first current source, having a resistor directly connected between the emitter of said first transistor and the second power supply pad, for supplying a bias current to said first transistor and for suppressing an influence of an inductance of a bonding wire connected between said second power supply pad and a second power supply; and
        a load resistor connected to the collector of said first transistor; and
    a bias voltage source, the base of said first transistor being connected through said bias voltage source to the first power supply pad, the collector of said first transistor being connected through said load resistor to the first power supply pad, and the emitter of said first transistor being connected through said first current source to the second power supply pad, said bias voltage source comprising:
        a first resistor connected between the base of said first transistor and the first power supply pad; and
        a second resistor connected between the base of said first transistor and the second power supply pad, for determining the operating point of said first transistor.

4. An equalizing and amplifying circuit as claimed in claim 3 wherein said first current source is a constant-current conducting resistor.

5. An equalizing and amplifying circuit, including an output terminal, in an optical signal receiving apparatus, comprising:
- a preamplifier circuit having an input terminal, operatively connected to the output of a light receiving element, for converting an optical signal into an electrical signal, and having an output terminal, said preamplifier circuit amplifying said electrical signal to output an amplified signal to said output terminal;
- an automatic gain control circuit, operatively connected to said output terminal of said preamplifier circuit, for amplifying the output amplified signal of said preamplifier circuit to a predetermined level;
- said preamplifier circuit comprising:
  - a first transistor having a common-base, having an emitter operatively connected to said input terminal, and having a collector operatively connected to said output terminal;
  - a first current source, operatively connected to the emitter of said first transistor, for supplying a bias current to said first transistor; and
  - a load resistor connected to the collector of said first transistor; and
  - a second transistor having an emitter commonly connected to the emitter of said first transistor and having a base connected to a control terminal, said control terminal being connected through a feedback loop to the output terminal of said equalizing and amplifying circuit.

6. An equalizing and amplifying circuit in an optical signal receiving apparatus including a firs power supply pad and a second power supply pad, and an output terminal, comprising:
- a preamplifier circuit having an input terminal, operatively connected to the output of a light receiving element, for converting an optical signal into an electrical signal, and having an output terminal, said preamplifier circuit amplifying said electrical signal to output an amplified signal to said output terminal;
- an automatic gain control circuit, operatively connected to said output terminal of said preamplifier circuit, for amplifying the output amplified signal of said preamplifier circuit to a predetermined level;
- said preamplifier circuit comprising:
  - a first transistor having a common-base, having an emitter operatively connected to said input terminal, and having a collector operatively connected to said output terminal;
  - a first current source, operatively connected to the emitter of said first transistor, for supplying a bias current to said first transistor; and
  - a load resistor connected to the collector of said first transistor;
  - a bias voltage source, the base of said first transistor being connected through said bias voltage source to the first power supply pad, the collector of said first transistor being connected through said load resistor to the first power supply pad, and the emitter of said first transistor being connected through said first current source to the second power supply pad; and
  - a second transistor having an emitter commonly connected to the emitter of said first transistor and having a base connected to a control terminal, said control terminal being connected through a feedback loop to the output terminal of said equalizing and amplifying circuit.

7. An equalizing and amplifying circuit as claimed in claim 6 wherein said first current source comprises a third transistor and a current limiting resistor, said third transistor having a collector connected to the emitter of said first transistor, a common-base, and an emitter connected to said input terminal, the emitter of said third transistor being connected through said current limiting resistor to the second power supply pad, said third transistor functioning to lower the input impedance of said preamplifier circuit.

8. An equalizing and amplifying circuit as claimed in claim 7, wherein the base of said third transistor is connected through a second bias voltage source to said first power supply pad.

9. An equalizing and amplifying circuit as claimed in claim 8, further comprising a noise suppressing resistor connected between the emitter of said second transistor and the collector of said third transistor.

10. An equalizing and amplifying circuit as claimed in claim 8, further comprising a noise suppressing resistor connected between the emitter of said first transistor and the collector of said third transistor.

11. An equalizing and amplifying circuit as claimed in claim 8, further comprising a first noise suppressing resistor connected between the emitter of said second transistor and the collector of said third transistor, and a second noise suppressing resistor connected between the emitter of said first transistor and the collector of said third transistor.

* * * * *

UNITED STATES PATENT AND TRADEMARK OFFICE
CERTIFICATE OF CORRECTION

PATENT NO. : 5,113,151
DATED : MAY 12, 1992
INVENTOR(S) : TAKUJI YAMAMOTO ET AL.

It is certified that error appears in the above-identified patent and that said Letters Patent is hereby corrected as shown below:

Col. 2, line 36, "to pream-" should be --to provide such an equalizing and amplifying circuit having a pream- --.

Col. 3, line 68, "fourth FIG. 12." should be --- fourth example of a preamplifier circuit in the circuit shown in FIG. 12.--.

Col. 4, line 65, "a" should be deleted.

Col. 5, line 8, "circuit transis-" should be --circuit includes transis- --;
line 9, "305" should be --305 and 307. The base of the transistor 305--.

Col. 7, line 9, "to Hag" should be --voltage--
line 31, "t e" should be --the--.

Col. 9, line 52, "AGC" should be --AGC circuit, there is a disadvantage in that the amplitude--.

Col. 10, line 45, "Therefore" should be --Therefore,--
line 59, "I ." should be --$I_0$.--.

Col. 12, line 4, "the $V_{CNTL}$." should be --the voltage applied to the control terminal $V_{CNTL}$.--;
line 26, "quency;" should be --quency.--;

UNITED STATES PATENT AND TRADEMARK OFFICE
CERTIFICATE OF CORRECTION

PATENT NO. : 5,113,151

DATED : MAY 12, 1992

INVENTOR(S) : TAKUJI YAMAMOTO ET AL.

It is certified that error appears in the above-identified patent and that said Letters Patent is hereby corrected as shown below:

Col. 13, line 6, "wires" should be --wires between the IC chip and the package can be decreased.--;

line 8, "improved Still" should be --improved. Still--.

Col. 15, line 2, "3" should be --3,--;

line 37, "firs" should be --first--.

Col. 16, line 25, "6" should be --6,--.

Signed and Sealed this

Thirteenth Day of July, 1993

Attest:

MICHAEL K. KIRK

Attesting Officer     Acting Commissioner of Patents and Trademarks